United States Patent
Mathur et al.

(10) Patent No.: US 7,222,317 B1
(45) Date of Patent: May 22, 2007

(54) CIRCUIT COMPARISON BY INFORMATION LOSS MATCHING

(75) Inventors: Anmol Mathur, San Jose, CA (US); Deepak Goyal, Santa Clara, CA (US)

(73) Assignee: Calypto Designs Systems, Santa Clara, CA (US)

( * ) Notice: Subject to any disclaimer, the term of this patent is extended or adjusted under 35 U.S.C. 154(b) by 340 days.

(21) Appl. No.: 10/822,166

(22) Filed: Apr. 9, 2004

(51) Int. Cl.
*G06F 17/50* (2006.01)

(52) U.S. Cl. .......................................... 716/5
(58) Field of Classification Search ............ 716/4, 716/1, 2, 5, 8, 18; 703/14; 717/136
See application file for complete search history.

(56) References Cited

U.S. PATENT DOCUMENTS

| | | | |
|---|---|---|---|
| 6,163,876 A * | 12/2000 | Ashar et al. .................. | 716/5 |
| 6,192,504 B1 * | 2/2001 | Pfluger et al. ................ | 716/1 |
| 6,363,520 B1 * | 3/2002 | Boubezari et al. ............ | 716/18 |
| 6,415,420 B1 * | 7/2002 | Cheng et al. .................. | 716/4 |
| 6,625,797 B1 * | 9/2003 | Edwards et al. .............. | 716/18 |
| 6,701,501 B2 * | 3/2004 | Waters et al. ................. | 716/8 |
| 6,745,160 B1 * | 6/2004 | Ashar et al. .................. | 703/14 |
| 6,772,399 B2 * | 8/2004 | Saluja et al. .................. | 716/2 |
| 6,807,651 B2 * | 10/2004 | Saluja et al. .................. | 716/2 |
| 6,832,357 B2 * | 12/2004 | Saluja et al. .................. | 716/2 |
| 6,877,150 B1 * | 4/2005 | Miller et al. .................. | 716/18 |
| 2005/0257200 A1 * | 11/2005 | Taylor ........................ | 717/136 |

* cited by examiner

*Primary Examiner*—Stacy A Whitmore
(74) *Attorney, Agent, or Firm*—William L. Botjer

(57) ABSTRACT

The present invention discloses a method and system for computer-aided circuit design for checking the equivalence of data flow graphs by splitting data flow graphs representing finite precision arithmetic circuits into lossless subgraphs representing infinite-precision arithmetic circuits, and edges with information loss. The set of lossless subgraphs generated are leveled, and checked for equivalence as expressions. The edges with information loss are compared by establishing the equivalence of their bit width. The present invention declares data flow graphs as equal, if the respective lossless subgraphs and the bit-width at the corresponding edges with information loss are equal.

8 Claims, 10 Drawing Sheets

CIRCUIT COMPARISON BY INFORMATION LOSS MATCHING

BACKGROUND

The present invention relates to the field of computer-aided chip design and, in particular, to comparison of circuits performing finite precision arithmetic operations, for equivalence.

Improved information processing has led to an increase in the complexity of the chips being used. With an increase in the complexity, a larger number of semiconductor devices, like logic gates, memories, central processing units, etc, are integrated in a single chip. This has generated a further demand for improvement in the existing techniques for circuit verification. In the rest of this application 'circuit' and 'chip' will be used interchangeably.

The process of circuit verification begins with the designing of the desired circuit. Circuits are designed using known computer-aided design tools, like Gemini CSX available from IKOS Systems, Cupertino, Calif., and System Realizer available from Quickturn Design Systems, Mountain View, Calif. These computer aided design tools use higher-level programming languages and Register Transfer Level (RTL) hardware programming languages to design a circuit. The higher level programming languages, and the RTL languages that are commonly used for circuit design are C and C++, and Verilog and VHDL respectively.

There are two main approaches to verify the correctness of a circuit. The first approach is known as Model Checking. In this approach, abstract properties that a circuit should satisfy are defined first. These properties are commonly defined using temporal logic, such as Linear Temporal Logic (LTL). Once these properties are defined, the verification of the circuit proceeds by checking that all the models of the circuit satisfy the property.

The second approach is based on equivalence checking of a circuit against a 'golden' model, i.e., another circuit that has been previously verified to be correct. An equivalence check is used to verify that a given circuit is functionally equal to the golden model. The golden model can be a circuit designed by higher level programming languages, like C, C++, etc., or could be an earlier version of the RTL circuit that needs to be refined.

Two main techniques have evolved to test the equivalence of circuits. In the first approach, the circuits are simulated for all possible set of inputs and the respective outputs are tested for equivalence. This process typically proceeds by creating a simulation driver that produces the simulation inputs and a simulation monitor that monitors the simulation outputs for equivalence. A limitation attached to this method is that with an increase in the complexity of circuits, covering all possible sets of inputs for determining equivalence becomes difficult. In addition, for complex circuits the time taken for simulation becomes high and as a result, the process of circuit comparison becomes slow.

The second approach is based on testing the equivalence of circuits by formal verification methods. In this approach, typically a circuit and the corresponding golden model are synthesized into bit-level designs. These bit-level designs are typically compared, using either decision diagram based techniques or SAT-based techniques. In the decision diagram based techniques, the bit-level designs are converted into canonic representations, which are then compared for equality. The most commonly used canonic representations are the Binary Decision Diagrams (BDDs). The SAT-based techniques transform the bit-level designs into boolean clauses, so that the clauses are simultaneously satisfiable, if and only if the circuits are inequivalent. The satisfiability of the clauses is determined through search-based techniques.

The main drawback of both approaches is that they require synthesis of the circuits being compared into bit-level designs. The representation of the synthesis tends to be exponential if the circuits are complex. Consequently, these approaches become impractical for complex circuits.

The problem associated with the blowing up of bit-level synthesis of complex circuits has been overcome by word-level techniques. One of the components of the word-level techniques for checking circuit equivalence is the use of theorem-provers for proving equivalence of arithmetic expressions.

Theorem provers, such as Cooperating Validity Checker (CVC), CVC Lite, developed by the Formal Verification Group of Stanford University, and Integrated Canonizer and Solver (ICS) developed by SRI, can be used to prove the equivalence of arithmetic expressions. These techniques check the equivalence of circuits involving arithmetic operations such as addition, subtraction, multiplication, division and comparison operations, such as 'less-than', etc. These theorem proving techniques use the associativity of addition and multiplication, and the distributivity of multiplication over addition, to transform arithmetic expressions into a unique canonic form, which can be compared for equality.

However, the theorem proving techniques such as CVC, CVC Lite and ICS can only test for the equivalence of arithmetic expressions of infinite precision. These techniques are not directly applicable for the comparison of circuits, since circuits are inherently associated with a finite precision. The principles of associativity and distributivity cannot be applied in the case of finite precision. For example, in the case of an infinite precision arithmetic expression such as $a*(b+c)$, the principle of distributivity can be applied to obtain the equivalent expression $a*b+a*c$. However, such principles cannot be applied in a circuit with three finite width inputs, a, b and c that perform the operation $a*(b+c)$, if the bit width of the output of any operator is different from that of the other operator. As a result, techniques such as CVC, CVC Lite and ICS cannot be directly used for the comparison of circuits.

In light of the preceding discussion, there exists a need for a method that efficiently compares arithmetic circuits with finite precision for equality. There is also a need of a method for circuit comparison that does not synthesize the circuits down to the bit-level. There is also a need of a method for circuit comparison that is computationally less intensive than the existing methods.

SUMMARY

An object of the present invention is to provide a system and method to compare data flow graphs representing finite precision arithmetic circuits for equivalence.

Another objective of the present invention is to provide an efficient method to split data flow graphs, representing finite precision arithmetic circuits, into lossless subgraphs of infinite precision.

Yet another objective of the present invention is to provide a computationally less intensive method of circuit comparison.

A data flow graph, in accordance with the present invention, is a schematic representation of an arithmetic circuit in terms of operators and the flow of information. A data flow graph comprises edges, ports and arithmetic operators. An edge represents input, output and intermediate signals to a circuit, and has a finite bit width associated with it. Each edge is further linked to an arithmetic operator by means of a source port and one or more sink ports. A port represents the intermediate input and output of arithmetic operations and the primitive inputs and outputs of the circuit design. Based on this, the input port of an edge is called its source port and the output port of an edge is called a sink port. An edge is linked to a source port but can be linked to one or more sink ports.

The present invention splits data flow graphs of finite-precision arithmetic circuits into lossless subgraphs, using the information loss at edges. The information loss at an edge is computed using the techniques of required precision and information content. The required precision at a port is defined as the minimum number of bits required at the port to represent any of its outputs. The information content at a port is defined as the minimum bit width required at the port to represent the output of the arithmetic operator linked to it. An edge is said to have an information loss if the information content at its source port and the required precision at its sink port are both greater than the bit width of the edge. These techniques are used to split a data flow graph at edges with information loss into lossless subgraphs.

The present invention checks the equality of data flow graphs by comparing the subgraphs that are generated above. These subgraphs are represented as expressions and checked for equivalence. The present invention uses theorem provers, like CVC Lite program to compare these expressions. Once the subgraphs are proven equal, the present invention checks the equivalence of the corresponding output edges that have information loss. The data flow graphs being compared are declared equal if the equality at the corresponding subgraphs and the edges with information loss is established.

BRIEF DESCRIPTION OF THE DRAWINGS

The preferred embodiments of the invention will hereinafter be described in conjunction with the appended drawings provided to illustrate, and not to limit the invention, wherein like designations denote like elements, and in which:

FIG. 3b illustrates the required precision of the ports present in the finite precision arithmetic circuit described in FIG. 3a;

FIG. 3c illustrates the information content of the ports present in the finite precision arithmetic circuit described in FIG. 3a;

DESCRIPTION OF PREFERRED EMBODIMENTS

Definitions

Figure 1:
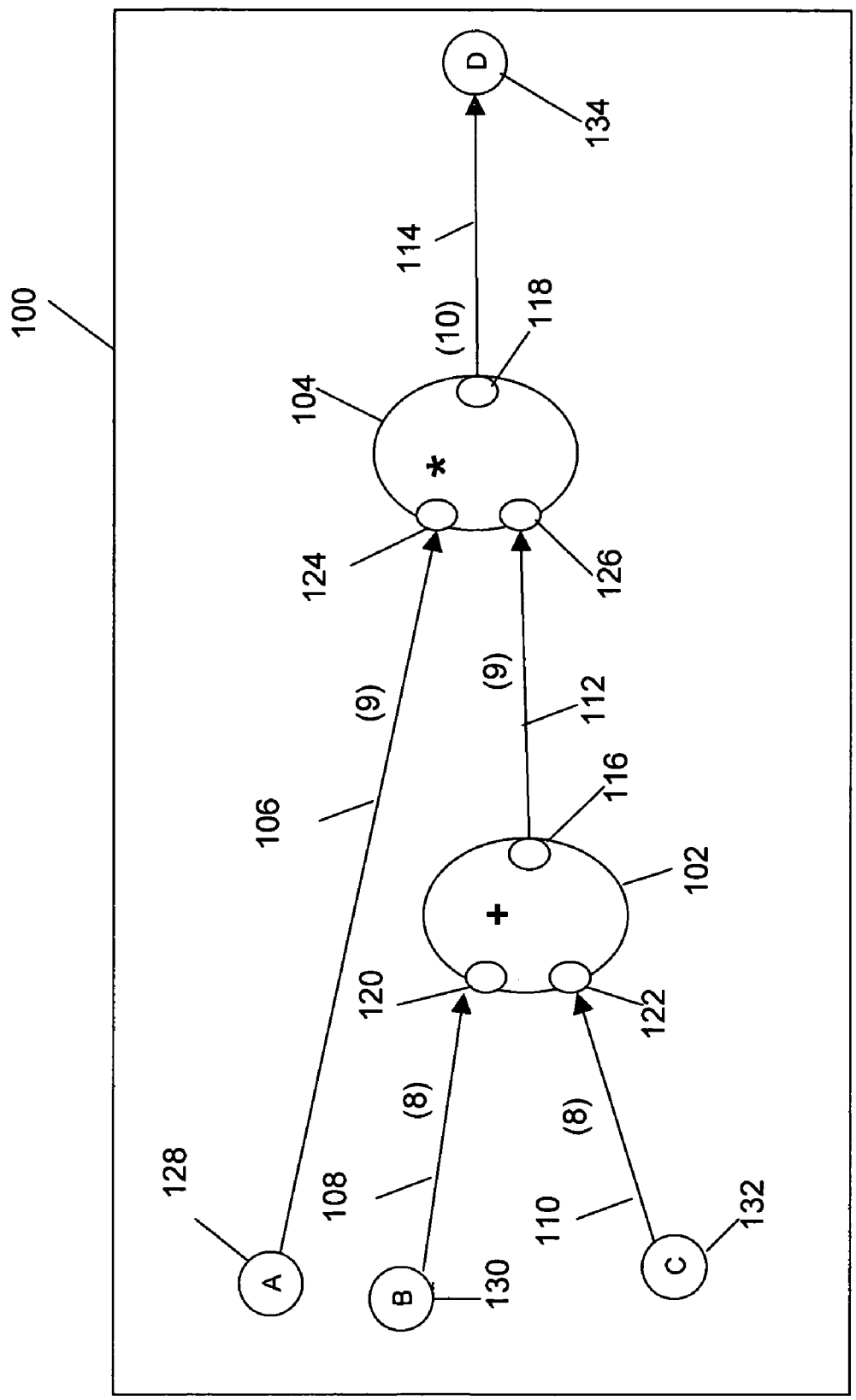
FIG. 1 illustrates the data flow graph of an exemplary finite precision arithmetic circuit.

Data flow graph: A data flow graph is a schematic representation of an arithmetic circuit in terms of operators and the flow of information. A data flow graph representation of expressions comprises function nodes corresponding to arithmetic operators, edges, and ports.

Edges: An edge represents an input, an output or an intermediate signal that connects ports. Each edge e has a bit width w(e) associated with it.

Port: A port represents the intermediate input and output of arithmetic operations, and the primitive inputs and outputs of the circuit design. In a data flow graph, ports are joined by an edge. Based on the flow of data, a port may be a source port to an edge or a sink port of an edge. Therefore, the data in a circuit flows from an arithmetic operator to the source port of an edge. The edge passes the data to one or more sink ports, wherein each sink port further links an edge to the next arithmetic operator.

Required precision: Required precision at a port in the data flow graph captures the bits of the port that are observable from any output of the data flow graph. The required precision at a port varies with the operators involved with a port. For a port 'p', the required precision RP(p) is defined in reverse topological order as follows:

RP(p-input)=RP(p-output), for input ports to operators involving addition, subtraction and multiplication;

RP(p-shift-data)=RP(p-output)−shift-amount, for the left-shift (<<) data operator, when the shift amount is constant;

RP(p-shift-data)=RP(p-output), for the left-shift (<<) data operator, when the shift amount is not constant;

RP(p-shift-data)=RP(p-output)+shift-amount, for right shift (>>) operation, when the shift amount is constant;

RP(p-shift-data)=RP(p-output)+2^(width of shift-amount)−1, for right shift (>>) operation, when the shift amount is not constant;

RP(p-shift-amount)=MAXINT, for shift amount port when the node type is concat ({ }). MAXINT is a symbol representing infinity.

RP(p-input)=0, for all input edges in a bit-concat node that contribute bits only in positions larger than RP(p_o), and RP(p_o) for the other edges; and For an edge e with bit width w(e), source port p and sink port p' the required precision at the sink port RP(p-sink) is defined as RP(p-sink)=w(e); and at the required precision at the source port RP(p-source) as RP(p-source)=max{min {RP(p'-sink), w(e)}}.

Required precision at an output port is by definition taken as the width of the output port.

Information content: The information content at a port is the minimum number of bits required to represent the function computed by the fan-in cone of the port. However, the upper bound on the information content can be defined as the minimum number of bits required to represent the output of an arithmetic operation, without any information loss. Since computing the upper bound on the information content is convenient for the purpose of calculations involved in the present invention, the upper bound of the information content is used in place of information content. The information content at a port varies with the operators involved with the port. For an output port, p-output, and input ports p'-input1, and p'-input2, the information content is computed in topological order as follows:

IC(p-output)=max{IC(p'-input1), IC(p'-input2)}+1, where the operation performed is addition and subtraction;

IC(p-output)=IC(p'-input1)+IC(p'-input2), where the operation performed is multiplication;

IC(p-output)=IC(p'-input)+shift-amount, where the operation performed is left shift(<<) and the shift amount is constant;

IC(p-output)=IC(p'-input)+2^(width of shift-amount)−1, where the operation performed is left shift(<<) and the shift amount is not constant;

IC(p-output)=IC(p'-input)−shift-amount, where the operation performed is right shift(>>) and the shift amount is constant;

IC(p-output)=IC(p'-input), where the operation performed is right shift(>>) and the shift amount is not constant;

IC(p-output)=MAXINT, where the operation performed is concat ({ }); and

For an edge e with bit width w(e), source port p and sink port p', the information content at the source port IC(p-source) is computed as the minimum amount of information required to represent the output of the arithmetic operation performed by the port. For a sink port p', the information content IC(p'-sink) is computed as the minimum of the information content of the corresponding source port p' and the bit width of the corresponding edge e, i.e., IC(p-sink) =min {IC(p'-source), w(e)}.

Information content at a primitive input port is the width of the port itself.

Information loss: An edge is said to have information loss if the information content of the corresponding source port IC(p-source) and the required precision of the corresponding sink port RP(p'-sink) are greater that the bit width of the edge w(e), i.e., IC(p-source)>w(e)<RP(p'-sink). In other words, an edge is said to have information loss if it first truncates the information supplied to it and then later expands the information.

The concepts of required precision and information content have been discussed in detail in the research paper by Anmol Mathur and Sanjeev Saluja, titled 'Improved Merging of Datapath Operators Using Information Content and Required Precision Analysis', presented at the Design Automation Conference 2001. The paper relates to minimizing the bit width of operators in a finite precision arithmetic circuit. To minimize the bit width of the operators, the paper proposes a method to split the data flow graph of a finite precision arithmetic circuit into subgraphs of infinite precision. The data flow graph of a finite precision arithmetic circuit is split into subgraphs of infinite precision by comparing the information content of the source port and the required precision of the sink port corresponding to an edge, to the bit-width of the edge. After the subgraphs of infinite precision are attained, the principles of associativity and distributivity are applied to identify the minimum bit-width that is required to perform an arithmetic operation of finite precision. The techniques of required precision and information content presented in the research paper have been used in the present invention to split the data flow graphs of circuits being compared into subgraphs of infinite precision. The subgraphs and subsequently the circuits are compared for equivalence in accordance with the present invention.

The present invention performs a comparison of finite precision circuits involving operations of addition, subtraction, multiplication, division, left shift (<<), right shift (>>), bit select ([ ]) and bit concat ({ }). The finite-precision circuits are compared by splitting the data flow graphs of finite-precision arithmetic circuits into lossless subgraphs and edges with information loss. These lossless subgraphs represent arithmetic circuits with infinite precision. A check for equivalence is then performed on the corresponding lossless subgraphs and the edges with information loss.

FIG. 1 illustrates the data flow graph of an exemplary finite-precision arithmetic circuit 100, performing the arithmetic operation a*(b+c). Finite precision arithmetic circuit 100 comprises arithmetic operators 102 and 104, performing summation and multiplication. Finite-precision arithmetic circuit 100 further comprises source ports 116, 118, 128, 130 and 132, and sink ports 120, 122, 124, 126 and 134. Source ports 128, 130 and 132 are primitive input signals A, B and C respectively to the circuit. Sink port 134 is the primitive output signal D of the circuit. Finite-precision arithmetic circuit 100 further comprises edges 106, 108, 110, 112 and 114 that link various source and sink ports. Each edge and port further has a finite bit width associated with it. If the bit-width is not explicitly specified, a port is assumed to have the same width as the edge.

Figure 2:
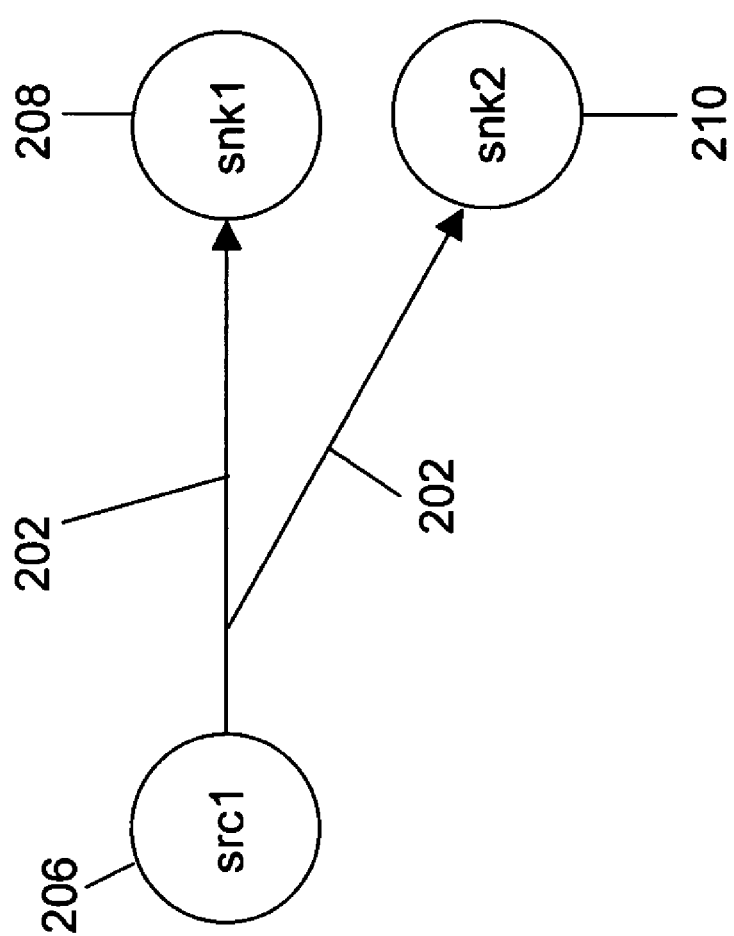
FIG. 2 illustrates the source port and sink ports of an edge present in a finite precision arithmetic circuit.

FIG. 2 illustrates the source and sink ports of an edge. In FIG. 2, an edge 202 is linked to a source port 206 and sink ports 208 and 210 respectively. Source port 206 and sink ports 208 and 210 may further link edge 202 to an arithmetic operator or they may act as sink ports for the inputs, and source ports for the output signals of a circuit.

Figure 3A:
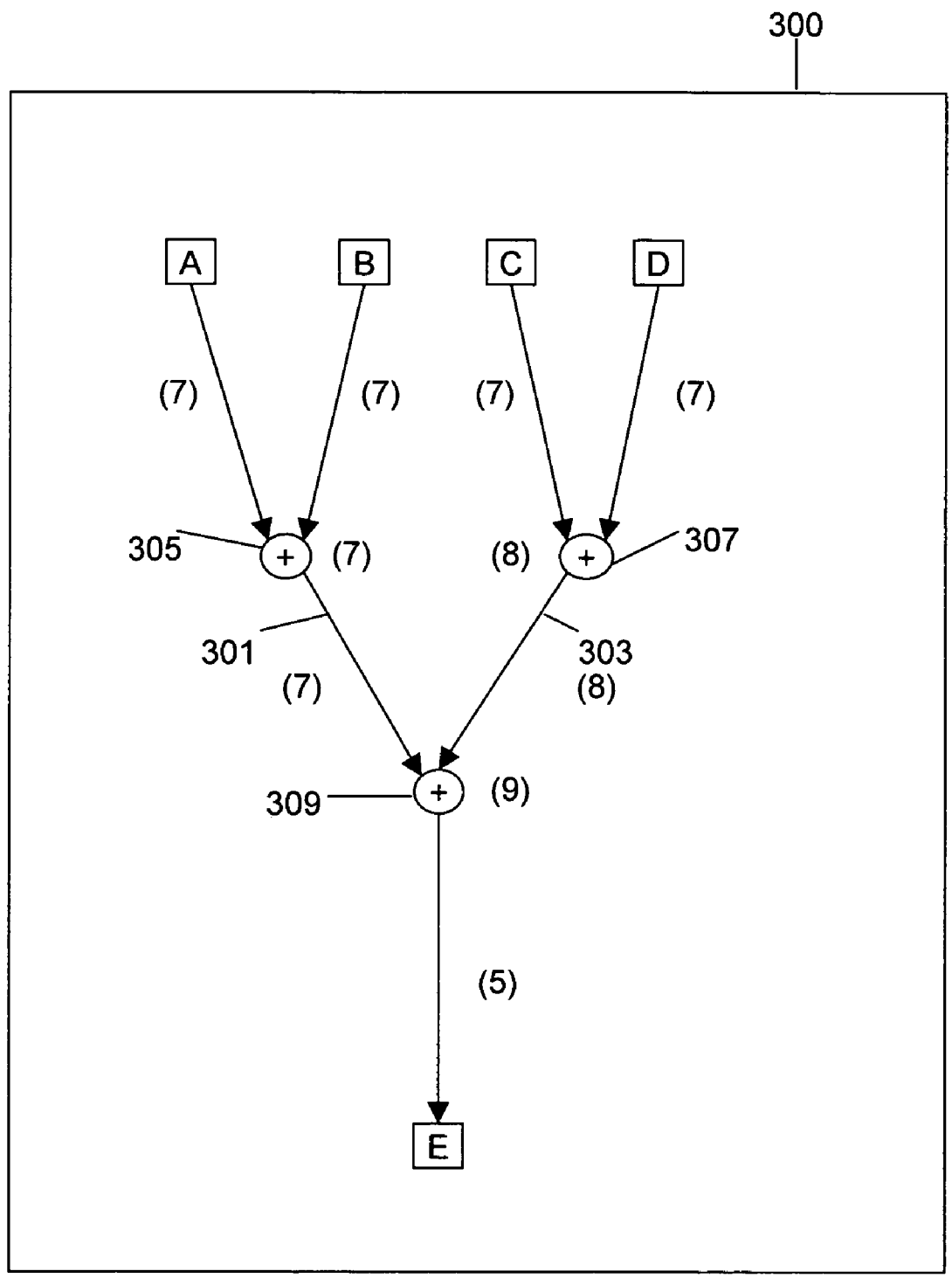
FIG. 3a illustrates an exemplary finite precision arithmetic circuit.

The present invention uses the concepts of required precision and information content to split a data flow graph into lossless subgraphs representing infinite-precision arithmetic circuits and edges with information loss. Required precision at a port in the data flow graph captures the bits of the port that are observable from the output of the data flow graph. The information content at a port is the minimum number of bits required to represent the output of an arithmetic operation linked to the port. FIG. 3a gives an exemplary illustration of a finite-precision arithmetic circuit. Circuit 300 represents a finite-precision arithmetic circuit comprising input signals A, B, C and D, and output signal E. Circuit 300 further comprises edges 301 and 303, and operators 305, 307 and 309.

Figure 3B:
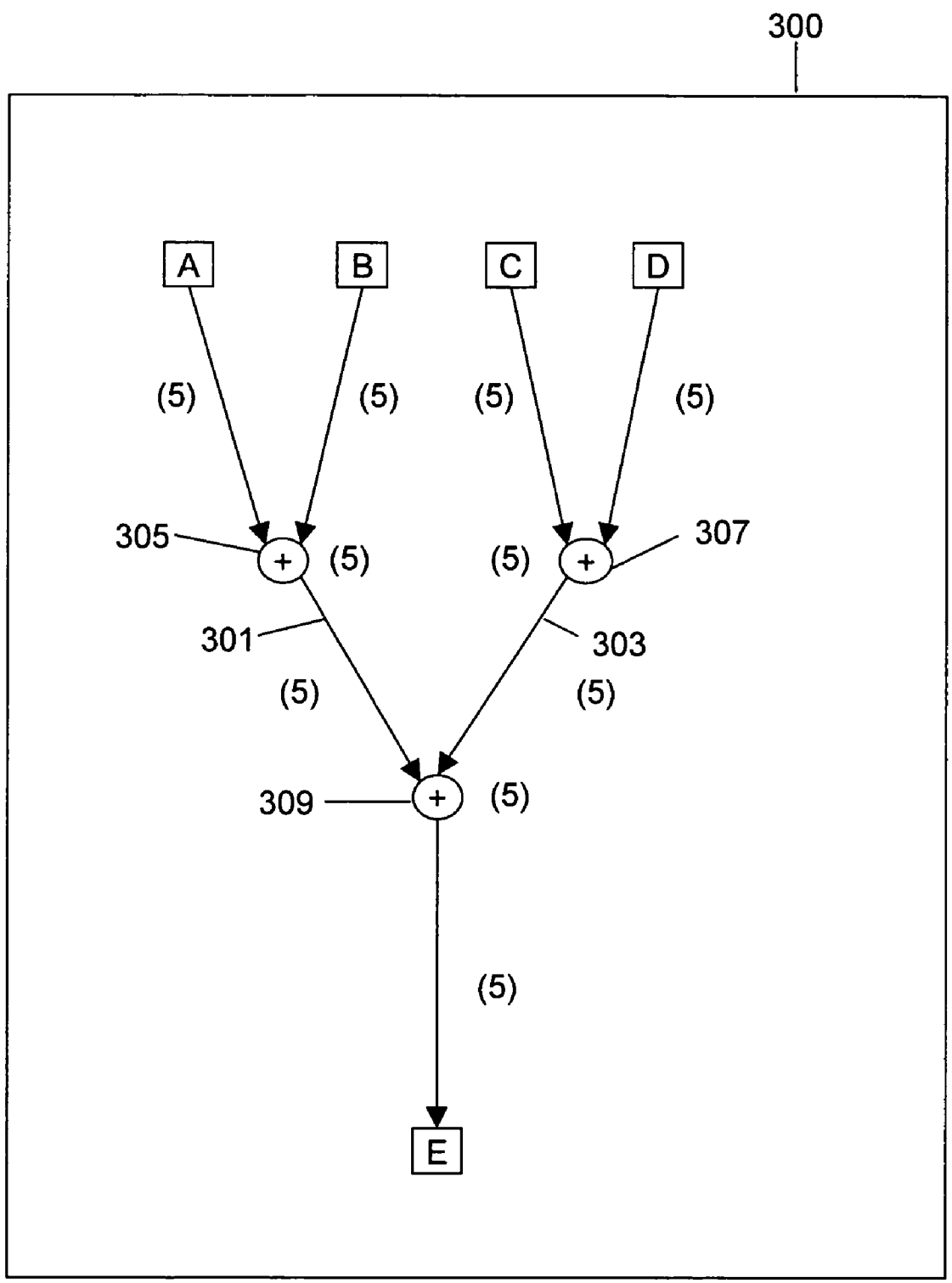

FIG. 3b illustrates the required precision for ports of finite-precision arithmetic circuit described in FIG. 3a. In circuit 300, signals A, B, C and D have bit width of 7 bits, and signal E has a bit width of 5 bits. This implies that the bit precision required at the input signals A, B, C and D, and edges 301 and 303, is 5 bits. Hence, the required precision at edges 301 and 303 and operators 305, 307 and 309, is 5 bits.

Figure 3C:
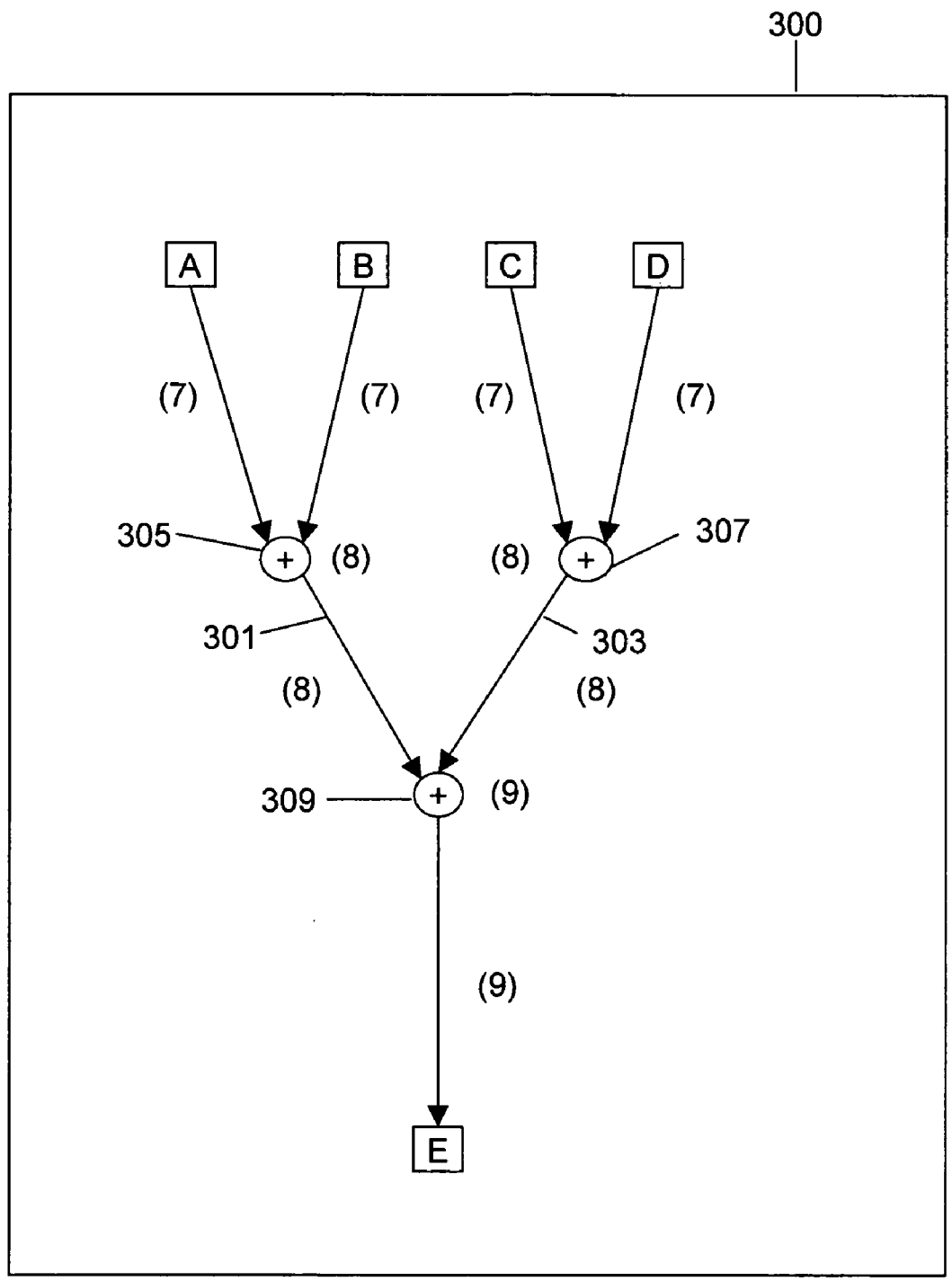

FIG. 3c illustrates the information content of the ports of circuit 300 described in FIG. 3a. In FIG. 3a, the output port of operator 305, for input signals A and B has a width of 7 bits. While the minimum bit width required to represent the output of the summation of signals A and B, with a bit width of 7 bits, is 8 bits. Hence, the information content of the output port of operator 305 is 8 bits. The concept of required precision and information content can be described further in FIG. 2. The required precision for sink ports 208 and 210 is defined as the width of their respective edge 202. In the case of source port 206, the required precision is defined as the maximum of the obtained set of minimum values of the required precision of sink port 208 and the bit width of edge 202, and required precision of sink port 210 and bit width of edge 202. For example, if the required precision of sink ports 206 and 210 are 6 bits and 5 bits respectively, and the bit-width of edge 202 is 7 bits, then the required precision for source port 206 is the maximum of the minimum values of the set 6 and 7 bits, and 5 and 7 bits, i.e. 6 bits.

The information content of source and sink ports in FIG. 2 can be explained as follows: the information content of source port 206 is defined as the minimum number of bits required at source port 206 to represent the output of the arithmetic operation performed by the arithmetic operator linked to it. In the case of sink ports 208 and 210, the information content is defined as the minimum of the information content of their respective source port 206 and bit width of corresponding edge 202. For example, if the information content of source port 204 is 4 bits and the width of edge 202 is 3 bits then the information content of sink port 208 will be the minimum of these two i.e., 3 bits.

Figure 4:
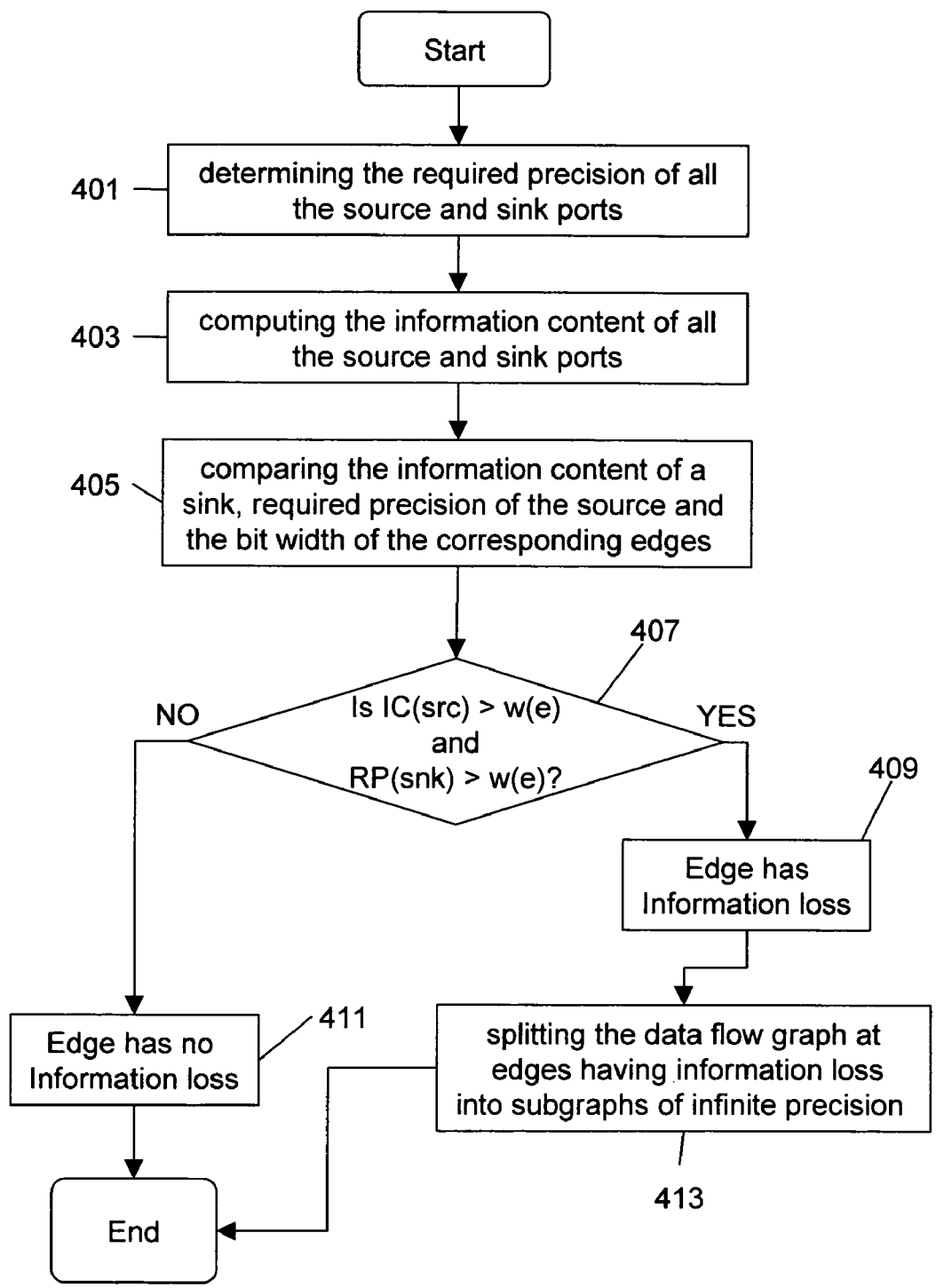
FIG. 4 illustrates the steps involved in the method for splitting a data flow graph into lossless subgraphs and edges having information loss in accordance with the present invention.

The steps involved in splitting a data flow graph are explained by means of a flowchart in FIG. 4. The method of splitting the data flow graph begins with step 401, where the required precision of the source and the sink ports for each edge of a circuit is computed. The required precision for each port is computed in the reverse topological order of the circuit. In step 403, the information content of the source ports and the sink ports for each edge of a circuit is computed. The information content for each port is computed according to the topological order of the circuit. In step 405, for each edge, the information content of the source port and the required precision of the sink port are compared to the bit width of the corresponding edge.

In step 407, for each edge, it is determined if the information content of its source port, IC(source), and the required precision of its sink port, RP(sink), are both greater than the bit width w(e) of the corresponding edge. In step 407, if both the information content at the source port and the required precision at the sink port of an edge are greater than the bit width of the edge, step 409 is performed. In step 409, the edge is identified as an edge with information loss. In step 407, if the information content of the source port is not greater than the bit width of the corresponding edge, or if the required precision of the source port is not greater than the bit width of the corresponding edge, step 411 is performed. In step 411, the edge is identified as a lossless edge. In step 413, the data flow graph is split into lossless subgraphs representing circuits of infinite precision. The data flow graph is split at the edges with information loss. These edges act as the output signals of the lossless subgraphs.

Figure 5A:
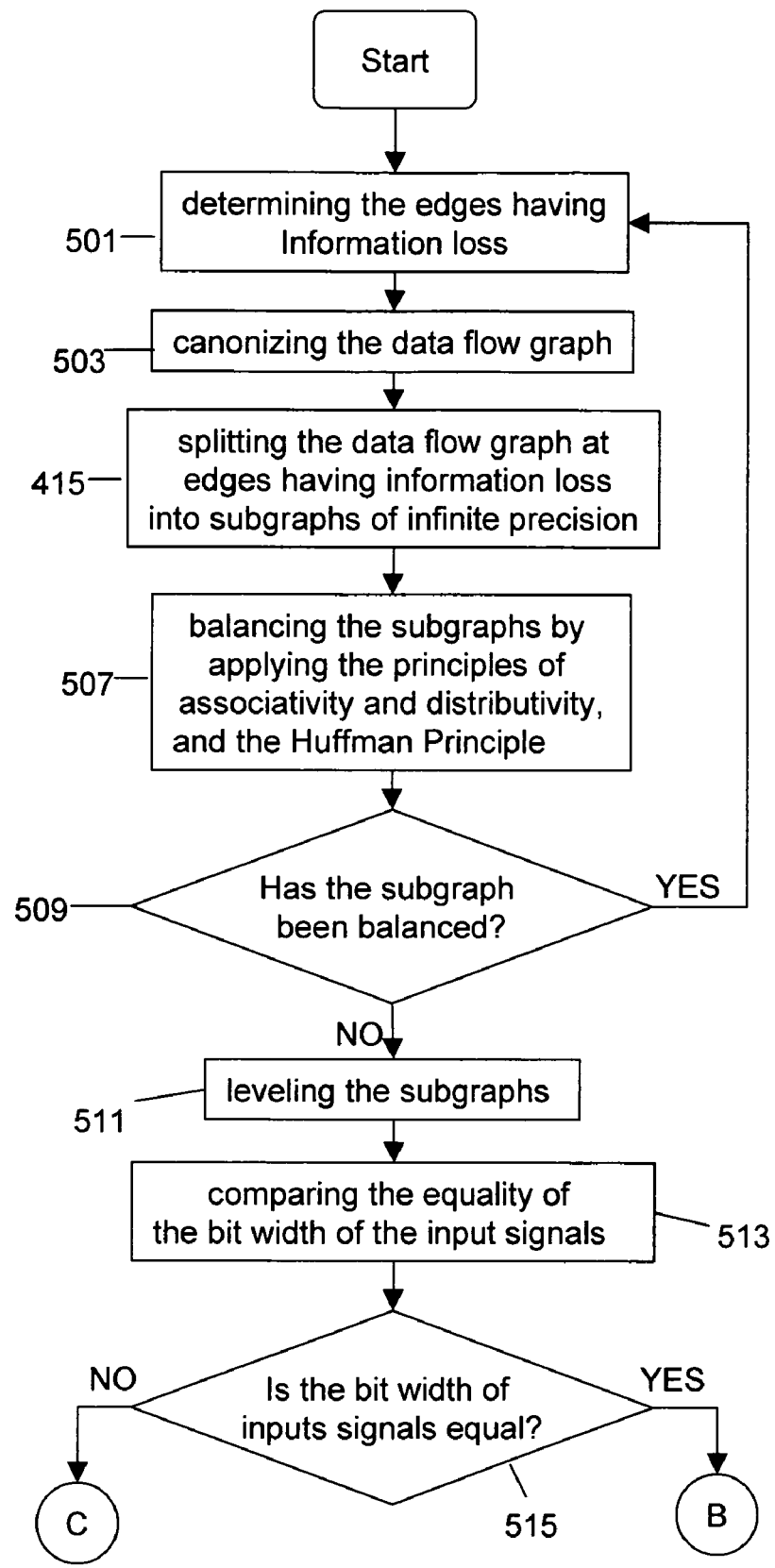
FIG. 5 illustrates the steps involved in the method for comparing the equivalence of data flow graphs representing finite precision arithmetic circuits in accordance with the present invention.
Figure 5B:
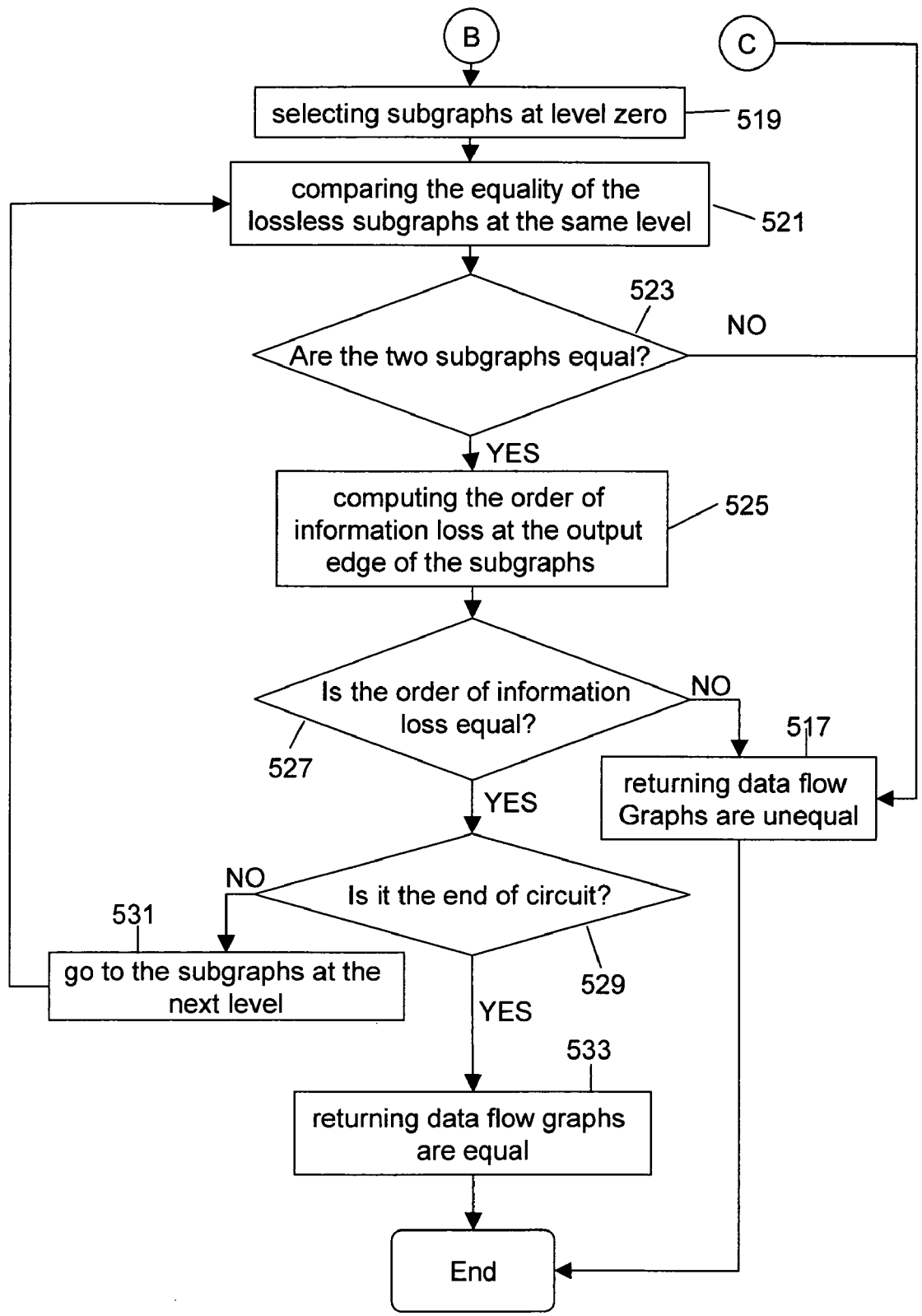

The technique mentioned above can be used to check the equivalence of the data flow graphs of finite-precision arithmetic circuits. The steps of comparison are explained by means of a flowchart in FIG. 5. In step 501, the method begins by determining the edges that have information loss. The edges that have information loss are identified by performing steps from 401 to 413, as mentioned in FIG. 4. In step 503, the edges that have been identified as having information loss, are canonized. Canonization is defined as a method where the arithmetic operations that generate information loss are pushed to the end of the data flow graph. For example, in case two edges x and y are first truncated by k bits i.e., $x/2^k$, and $y/2^k$, and then added i.e. $x/2^k + y/2^k$, the truncation occurs at two edges individually. The truncation also occurs before addition. During canonization, by using the principles of distributivity of multiplication over addition, the operation of truncation can be performed after addition, i.e., $(x+y)/2^k$. Hence, the operation is pushed towards the end of the data flow graph.

In step 415, each data flow graph is divided at the edges with information loss. In step 507, the lossless subgraphs obtained are balanced using the principles of associativity of addition and multiplication, distributivity of multiplication over addition, and the Huffman Principle. The Huffman Principle computes the upper bound on the information content at a port. For example, in case a subgraph has the following set of arithmetic operations:

$O1(8)=a(7)+b(7),$ $O2(9)=c(7)+O1(8),$ and $O3(10)=d(7)+O2(8);$ by application of the principles of associativity, the subgraphs can be balanced to the following arithmetic operations:

$O1(8)=a(7)+b(7),$ $O2(8)=c(7)+d(7),$ and $O3(9)=O1(8)+O2(8).$

Further, in step 507, the upper bound on the information content of the ports for the balanced outputs is computed using the Huffman Principle. This step facilitates the optimization of bit width required at an edge. Hence, the number of edges that have information loss are further reduced. For example, in the previous example, the information content of the source port of edge O3 is 10 bits. Therefore, if edge O3 has a bit width of 9 bits, and the required precision of the sink port of edge O3 is 10 bits, edge O3 would be identified as an edge with information loss. Whereas, after balancing and applying the Huffman Principle it is observed that the information content at the source port of the edge is 9 bits. Hence, after balancing the edge would not be identified as an edge having information loss.

Figure 6:
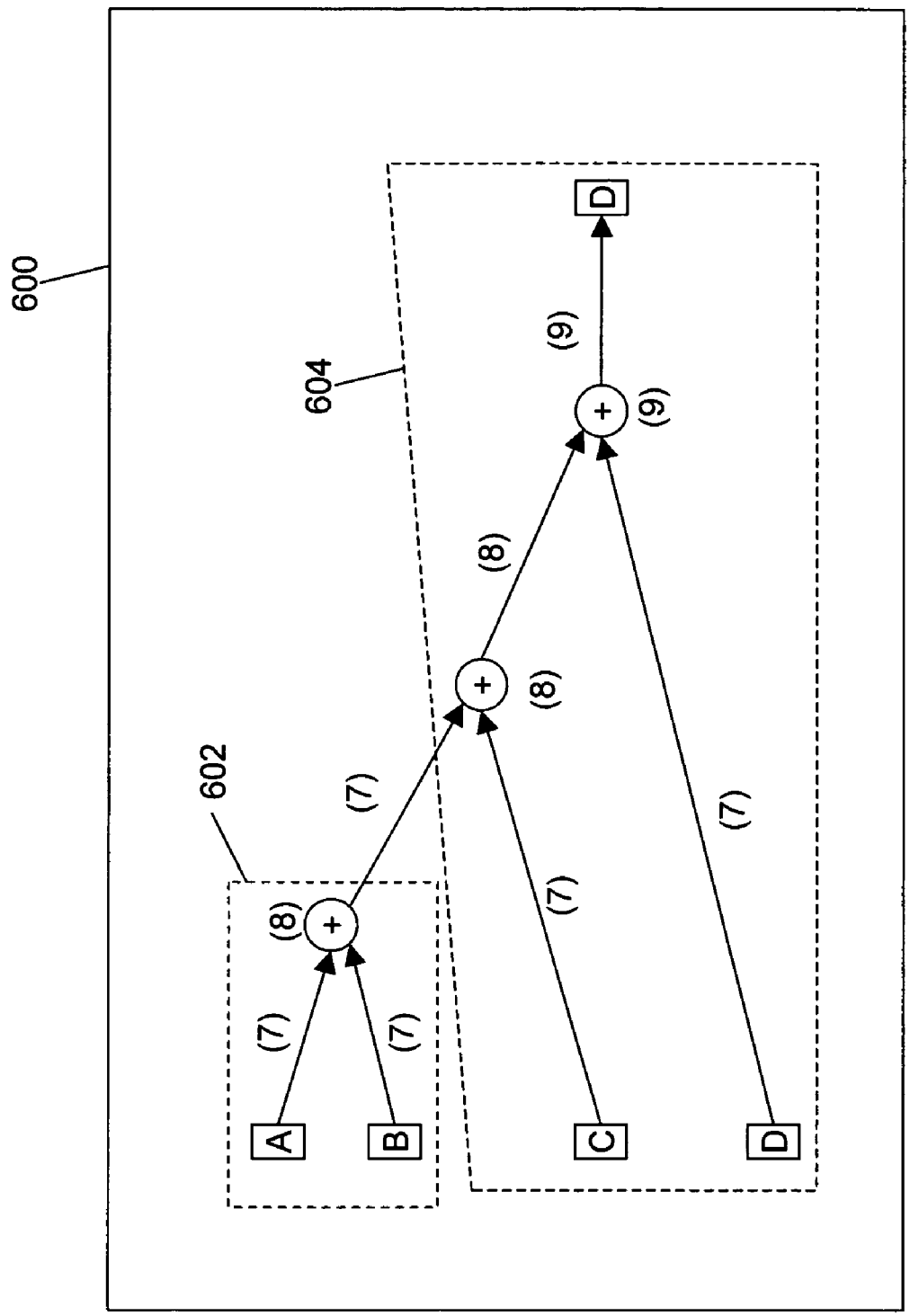
FIG. 6 gives an exemplary illustration of a data flow graph being split in lossless subgraphs.
Figure 7:
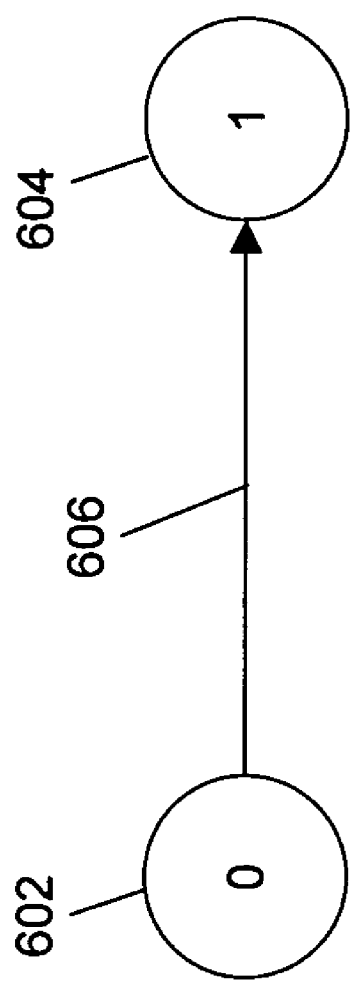
FIG. 7 illustrates the level numbers assigned to the subgraphs represented in FIG. 6.

In step 509, it is verified whether a subgraph is balanced. In case a subgraph is balanced, steps 501 to 507 are performed iteratively. In step 509, if a subgraph is not balanced, the method disclosed levels it in topological order, in step 511. The step of leveling is performed to facilitate the comparison of lossless subgraphs that are at the same level across the data flow graphs that are being compared. For example, if we are comparing two data flow graphs for checking equality, the subgraphs lying at level 0 in both these data flow graphs will be tested for equality. The step of leveling is further explained with reference to FIG. 6 and FIG. 7. FIG. 6 gives an exemplary illustration of data flow graph 600 that is split into lossless subgraphs 602 and 604 at an edge 606 with an information loss. FIG. 7 represents subgraphs 602 and 604 as vertices, and indicates their corresponding level numbers as 0 and 1. In accordance with the present invention, a lossless subgraph is assigned a level number 0, if it does not have a predecessor lossless subgraph. In case a subgraph has a predecessor(s) lossless subgraph, the level number is given by one plus the maximum of the level numbers of all its predecessors.

In step 513, input signals to the lossless subgraphs at level zero are tested for equivalence. This step is performed by comparing the bit width of different input signals. Therefore, in step 515, if the bit widths of input signals of lossless subgraphs lying at level zero are tested as unequal, step 517 is performed. In step 517, the data flow graphs compared are returned unequal. For example, if two circuits have input signals of bit widths of 6 and 7 bits, the present invention will return them as unequal by comparing the bit widths of their inputs. In step 515, in case the bit widths are tested equal, step 519 is performed. In step 519, lossless subgraphs at level zero are selected for testing their equivalence.

In step 521, the lossless subgraphs are then compared for equivalence. In step 523, a check is performed for comparing the equivalence of zero level lossless subgraphs. In step 523, if the lossless subgraphs are returned unequal, the method goes to step 517 and gives the result that the data flow graphs compared are unequal. In step 523, in case the two lossless subgraphs are tested equal, step 525 is performed. In step 525, the bit-widths of the output edges of the lossless subgraphs that have information loss, are compared.

In step 527, if the bit widths of the output edges are not equal, the method goes to step 517, and gives the result that the data flow graphs compared are unequal. In step 527, if the bit widths of the output edges are equal, the method moves to step 529. In step 529, it is tested whether the end of the data flow graph has been reached. The test is performed by identifying whether it has reached the lossless subgraph with the highest level number. In step 529, if the test returns that the highest level number has not been reached, step 531 is performed. In step 531, the lossless subgraphs with the next higher level number are compared. The lossless subgraphs that are compared have the same level number. The input edges corresponding to the lossless subgraphs that are compared have been tested for equivalence in step 527. The method then tests the equivalence of the subsequent subgraphs by iteratively performing steps 521, 523, 525 and 529. In step 529, in case the lossless subgraph being tested is the last subgraph in the respective data flow graph, step 533 is performed. In step 533, the method returns that the data flow graphs are equal.

In accordance with an embodiment, subgraphs are tested for equivalence using the Cooperating Validity Checker Lite (CVC Lite) program. The CVC Lite program developed by the Formal Verification Group of Stanford University tests the equivalence of expressions. The present invention converts the infinite-precision arithmetic circuits represented by subgraphs generated to expressions. The CVC Lite program provides a comparison of linear as well as non-linear arithmetic circuits for the expressions compared. This implies that the arithmetic operations that represent multiplication by a constant or non-constant value can also be represented by expressions.

An advantage of the present invention is that it provides an efficient method for the comparison of finite-precision arithmetic circuits. Techniques known in the art provide efficient algorithms for the comparison of arithmetic expressions of infinite precision. These techniques use the principles of associativity of addition and multiplication and the distributivity of multiplication.

Another advantage of the present invention is that it provides a conservative approach to circuit comparison. The method used by the present invention does not give false positives.

The disclosed method or any of its components may be written by using any of the higher order programming languages such as C, C++, JAVA, or any other higher level programming language.

The system, as described in the disclosed method, or any of its components may be embodied in the form of a processing machine. Typical examples of a processing machine include a general-purpose computer, a programmed microprocessor, a micro-controller, a peripheral integrated circuit element, and other devices or arrangements of devices, which are capable of implementing the steps that constitute the disclosed method.

The processing machine executes a set of instructions that are stored in one or more storage elements, in order to process input data. The storage elements may also hold data or other information as desired. These storage elements may be in the form of a database or a physical memory element present in the processing machine.

The set of instructions may include various instructions that instruct the processing machine to perform specific tasks, such as the steps that constitute the disclosed method. The set of instructions may be in the form of a program or software. The software may be in various forms such as system software and application software. Further, the software might be in the form of a collection of separate programs, a program module with a larger program or a portion of a program module. The software might also include modular programming in the form of object-oriented programming. The processing of input data by the processing machine may be in response to user commands, or in response to the results of previous processing or in response to a request made by another processing machine.

A person skilled in the art can appreciate that it is not necessary that the various processing machines and/or storage elements be physically located in the same geographical location. The processing machines and/or storage elements may be located in geographically distinct locations and connected to each other to enable communication. Various communication technologies may be used to enable communication between the processing machines and/or storage elements. Such technologies include connection of the processing machines and/or storage elements, in the form of a network. The network can be an intranet, an extranet, the Internet or any client server models that enable communication. Such communication technologies may use various protocols such as TCP/IP, UDP, ATM or OSI.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method used in computer-aided circuit design for comparing two finite-precision arithmetic circuits for equivalence, each finite-precision arithmetic circuit being represented by a data flow graph, the two finite-precision arithmetic circuits being compared for equivalence by checking the equivalence of the corresponding data flow graphs, each of the two data flow graphs of each of the two finite-precision arithmetic circuits comprising a plurality of edges wherein each edge has a finite bit width, an edge being further connected to a source port and one or more sink ports, the source port and the sink ports linked to an edge further connecting the edge to a plurality of arithmetic operators, each port further having a required precision and an information content associated with it, the required precision of a port being the maximum bits of the port observed at any of the output of the port, the information content of a port being the minimum bits required to represent the output of an arithmetic operation, the method comprising the steps of:

a. determining edges of each of the two data flow graphs, having information loss, wherein an edge has an information loss if the information content of the corresponding source port and the required precision of any of the corresponding sink ports are greater than the bit-width of the edge;

b. canonizing each of the two data flow graphs, the each of the two data flow graphs being canonized by canonizing the edges having information loss, the edges being canonized by pushing the arithmetic operations that generate information loss to the end of the data flow graph;

c. splitting each of the two data flow graphs at the edges having information loss, into lossless sub-graphs, each of the lossless sub-graphs representing an infinite-precision circuit, the edges having information loss acting as output signals of the lossless sub-graphs;

d. balancing each of the lossless sub-graphs of each of the two data flow graphs, the each of the lossless sub-graphs being balanced to minimize the information losses at the edges of each of the lossless sub-graphs;

e. leveling each of the lossless sub-graphs of each of the two data flow graphs in the topological order of each of the data flow graphs, the level being the order of existence of each of the lossless sub-graphs in the corresponding data flow graph, whereby each of the lossless sub-graphs is leveled for comparison of two lossless sub-graphs at the same level; and f. checking the equivalence of the two data flow graphs using the corresponding lossless sub-graphs, the step of checking the equivalence comprising the steps of:

i. comparing the lossless sub-graphs lying at level zero, in each of the two data flow graphs, for equivalence, wherein the lossless sub-graphs lying at level zero, being compared only if the input signals to each of the two data flow graphs have the same bit-width;

ii. comparing the bit-width of the output edges of the lossless sub-graphs lying at the same level in each of the two data flow graphs, the output edges having information loss, wherein the bit-width of the output edges of the lossless sub-graphs being compared, if the each of the preceding lossless sub-graphs are compared equal;

iii. comparing the lossless sub-graphs with next higher level number in each of the two data flow graphs for equivalence, wherein the lossless sub-graphs with next higher level number being compared only, if each of the preceding lossless sub-graphs are compared equal, and the bit width of the preceding edges are same; and repeating the steps ii and iii, until a lossless sub-graph being used for comparison is the last lossless sub-graph in the corresponding data flow graph; and returning a result of the comparison.

2. The method as recited in claim 1 further comprising the steps of:

a. computing the required precision of the source port and the sink ports corresponding to each edge wherein the required precision is computed in the reverse topological order of a finite-precision arithmetic circuit; and b. determining the information content of the source port and the sink ports corresponding to each edge, wherein the information content being computed in the topological order of the finite-precision arithmetic circuit.

3. The method as recited in claim 1, wherein the step of comparing the lossless sub-graphs for equivalence comprises the steps of:

a. generating expressions for the lossless sub-graphs that are being compared, each of the lossless sub-graphs representing an infinite-precision arithmetic circuit, the expressions being generated not having finite edge widths; and b. comparing the lossless sub-graphs by checking the equality of the corresponding generated expressions, the equality of the generated expressions being checked, by using a theorem proving technique.

4. The method as recited in claim 3, wherein the theorem proving technique is a Cooperating Validity Checker (CVC) lite program.

5. The method as recited in claim 1, wherein each of the lossless sub-graphs are balanced by using the Huffman Principle and the principles of associativity of addition and multiplication, and the distributivity of multiplication over addition.

6. The method as recited in claim 1, wherein the leveling each of the lossless sub-graphs of each of the two data flow graphs in the topological order comprises the steps of:

a. assigning a level number zero to a lossless sub-graph of the data flow graph, if the lossless sub-graph does not have at least one predecessor lossless sub-graph in the corresponding data flow graph; and b. assigning a level number as one plus the maximum of the level numbers of all the predecessors of a lossless sub-graph, if the lossless sub-graph has at least one predecessor lossless sub-graph in the corresponding data flow graph.

7. A computer program product, the computer program product comprising a computer usable medium having a computer readable program code embodied therein for comparing two finite-precision arithmetic circuits for equivalence, each finite-precision arithmetic circuit being represented by a data flow graph, the two finite-precision arithmetic circuits being compared for equivalence by checking the equivalence of the corresponding data flow graphs, each of the two data flow graphs comprising a plurality of edges wherein each edge has a finite bit width, an edge being further connected to a source port and one or more sink ports, the source port and the sink ports linked to an edge further connecting the edge to a plurality of arithmetic operators, each port further having a required precision and an information content associated with it, the required precision of a port being the maximum bits of the port observed at any of the output of the port, the information content of a port being the minimum bits required to represent the output of an arithmetic operation, the computer program code performing steps of:

a. determining edges having information loss, for each of the two data flow graphs, wherein an edge has an information loss if the information content of the corresponding source port and the required precision of any of the corresponding sink ports are greater than the bit-width of the edge;

b. canonizing each of the two data flow graphs, the each of the two data flow graphs being canonized by canonizing the edges having information loss, the edges being canonized by pushing the arithmetic operations that generate information loss to the end of the data flow graph;

c. splitting each of the two data flow graphs, at the edges having information loss, into lossless sub-graphs, each of the lossless sub-graphs representing an infinite-precision circuit, the edges having information loss acting as output signals of the lossless sub-graphs;

d. balancing each of the lossless sub-graphs of each of the two data flow graphs, each of the lossless sub-graphs being balanced to minimize the information losses at the edges of each of the lossless sub-graphs;

e. leveling each of the lossless sub-graphs of each of the two data flow graphs in a topological order of each of the data flow graphs, the level being the order of existence of each of the lossless sub-graphs in the corresponding data flow graph, whereby each of the lossless sub-graphs is leveled for comparison of two lossless sub-graphs at the same level; and f. checking the equivalence of the two data flow graphs using the corresponding lossless sub-graphs, the step of checking the equivalence comprising the steps of:

i. comparing the lossless sub-graphs lying at level zero, in each of the two data flow graphs, for equivalence, wherein the lossless sub-graphs lying at level zero, being compared only if the input signals to each of the two data flow graphs have the same bit-width;

ii. comparing the bit-width of the output edges of the lossless sub-graphs, lying at the same level, in each of the two data flow graphs, the output edges having information loss, wherein the bit-width of the output edges of the lossless sub-graphs being compared if the each of the preceding lossless sub-graphs are compared equal;

iii. comparing the lossless sub-graphs with next higher level number in each of the two data flow graphs for equivalence, wherein the lossless sub-graphs with next higher level number being compared only, if each of the preceding lossless sub-graphs are compared equal and the bit width of the preceding edges are same; and repeating the steps ii and iii, until a lossless sub-graph being used for comparison is the last sub-graph in the corresponding data flow graph; and returning a result of the comparison.

8. The computer program product described in claim 7, wherein the computer program code further performs the steps of:

a. computing the required precision of the source port and the sink ports corresponding to each edge wherein the required precision is computed in the reverse topological order of a finite-precision arithmetic circuit; and b. determining the information content of the source port and the sink ports corresponding to each edge, wherein the information content being computed in the topological order of the finite-precision arithmetic circuit.

* * * * *